(12) United States Patent
Kang

(10) Patent No.: US 12,050,061 B2
(45) Date of Patent: Jul. 30, 2024

(54) SHROUDED POWDER PATCH

(71) Applicant: Aavid Thermalloy, LLC, Laconia, NH (US)

(72) Inventor: Sukhvinder S. Kang, Concord, NH (US)

(73) Assignee: Aavid Thermalloy, LLC, Laconia, NH (US)

( * ) Notice: Subject to any disclaimer, the term of this patent is extended or adjusted under 35 U.S.C. 154(b) by 128 days.

(21) Appl. No.: 17/546,261

(22) Filed: Dec. 9, 2021

(65) Prior Publication Data

US 2022/0187023 A1   Jun. 16, 2022

Related U.S. Application Data

(60) Provisional application No. 63/125,076, filed on Dec. 14, 2020.

(51) Int. Cl.
| | | |
|---|---|---|
| *H01L 23/373* | (2006.01) | |
| *F28D 1/02* | (2006.01) | |
| *F28D 15/02* | (2006.01) | |
| *F28F 3/06* | (2006.01) | |
| *H01L 23/44* | (2006.01) | |

(Continued)

(52) U.S. Cl.
CPC ......... *F28D 1/0226* (2013.01); *F28D 1/0206* (2013.01); *F28D 15/02* (2013.01); *F28F 3/06* (2013.01); *H01L 23/3733* (2013.01); *H01L 23/44* (2013.01); *H05K 7/203* (2013.01); *F28D 2001/0286* (2013.01); *F28D 2021/0028* (2013.01); *H01L 23/427* (2013.01); *H05K 7/20309* (2013.01)

(58) Field of Classification Search
CPC ....... H01L 23/10; H01L 23/44; H01L 23/427; H01L 23/3733; H05K 7/20309; H05K 7/203; F28D 15/02; F28D 2021/0028
See application file for complete search history.

(56) References Cited

U.S. PATENT DOCUMENTS 4,619,316 A * 10/1986 Nakayama ............ F28F 13/187
257/713
4,694,378 A * 9/1987 Nakayama ............ H01L 23/427
174/15.1

(Continued)

FOREIGN PATENT DOCUMENTS

EP          3 229 573 A1    10/2017
JP          H09-045829 A     2/1997

(Continued)

OTHER PUBLICATIONS

International Search Report and Written Opinion for International Application No. PCT/US2021/062808, mailed Apr. 12, 2022.

(Continued)

*Primary Examiner* — Paul Alvare
(74) *Attorney, Agent, or Firm* — Wolf, Greenfield & Sacks, P.C.

(57) ABSTRACT

A heat sink for use in an immersion cooling system that includes a sintered powder structure enclosed in a porous enclosure. The porous enclosure has openings, e.g., formed by a mesh, with a size to help contain sintered powder particles that may be dislodged during operation of the heat sink.

24 Claims, 2 Drawing Sheets

(51) Int. Cl.
H05K 7/20 (2006.01)
*F28D 21/00* (2006.01)
*H01L 23/427* (2006.01)

(56) References Cited

U.S. PATENT DOCUMENTS

| | | | | |
|---|---|---|---|---|
| 4,704,658 | A * | 11/1987 | Yokouchi | H05K 7/203 |
| | | | | 361/698 |
| 4,757,370 | A * | 7/1988 | Agonafer | H01L 23/427 |
| | | | | 257/715 |
| 5,349,499 | A * | 9/1994 | Yamada | H05K 7/203 |
| | | | | 165/104.33 |
| 5,688,398 | A * | 11/1997 | Jacquelin | H05K 7/203 |
| | | | | 165/104.33 |
| 8,619,425 | B2 * | 12/2013 | Campbell | H05K 7/203 |
| | | | | 361/689 |
| 10,123,454 | B2 * | 11/2018 | Saito | H05K 7/20236 |
| 10,275,002 | B2 * | 4/2019 | Wyrwas | G06F 1/20 |
| 2008/0237845 | A1 * | 10/2008 | Kim | G06F 1/203 |
| | | | | 257/715 |
| 2013/0091868 | A1 * | 4/2013 | Campbell | H05K 7/203 |
| | | | | 62/3.2 |
| 2014/0321053 | A1 * | 10/2014 | Donnelly | H05K 7/20209 |
| | | | | 361/691 |
| 2017/0064862 | A1 * | 3/2017 | Miyoshi | H01L 23/32 |
| 2018/0070477 | A1 * | 3/2018 | Saito | H05K 7/20 |
| 2021/0293488 | A1 * | 9/2021 | Lewis | F28D 15/0233 |

FOREIGN PATENT DOCUMENTS

| | | | | |
|---|---|---|---|---|
| JP | 2013243249 | A * | 12/2013 | F28D 15/02 |
| JP | 2015197245 | A * | 11/2015 | |

OTHER PUBLICATIONS

International Preliminary Report on Patentability for International Application No. PCT/US2021/062808, mailed Jun. 29, 2023.

* cited by examiner

SHROUDED POWDER PATCH

RELATED APPLICATION

This Application claims priority under 35 U.S.C. § 119(e) to U.S. Provisional Application Ser. No. 63/125,076, entitled "SHROUDED POWDER PATCH" filed Dec. 14, 2020, which is herein incorporated by reference in its entirety.

FIELD OF INVENTION

A heat sink for use in immersion cooling systems, e.g., for cooling electronics using a bath of cooling fluid.

BACKGROUND

With the development of electronic technology, heat dissipation requirements for computer processing devices, e.g., integrated circuits or chips, has increased, requiring ever higher efficiency heat exchange devices to remove the heat generated by these devices. One technique for cooling electronic devices is to immerse the devices and/or a heat sink thermally connected to the devices in a dielectric cooling liquid. Heat is dissipated from the devices by boiling or otherwise heating the cooling liquid in contact with the devices and/or heat sink. The vapor and/or heated liquid is subsequently cooled to return to a denser liquid form and the cooling cycle continues.

SUMMARY OF INVENTION

In some embodiments, an immersion cooling system includes a tank configured to hold a cooling liquid, a heat generating device (such as an integrated circuit or other electronic device) arranged in the tank and configured to generate heat, and a heat sink thermally coupled to the heat generating device. In some cases, the heat generating device includes an electronic circuit that is in contact with cooling liquid along with the heat sink. The heat sink, which can be employed in an immersion cooling system or in other applications, can include a base coupled to the heat generating device so as to receive heat from the heat generating device, and a sintered powder thermally coupled to the base and configured to receive heat from the base and transfer the heat to the cooling liquid. The sintered powder can include sintered particles that are joined together to form a contiguous structure having spaces between the particles to form fluid passageways in the contiguous structure. The spaces and passageways permit cooling liquid to flow into the fluid passageways and permit vapor bubbles generated by transfer of heat from the sintered powder to the cooling liquid to flow out of the passageways. By transferring heat to the cooling liquid in this way, the sintered powder can cool the base, and thus the heat generating device. The sintered particles can be formed from metal powder having a size of 10 to 200 microns and the sintered particles can have a size that is larger than the metal powder used to form the sintered particles. For example, metal powder having a size of 10 to 50 microns can be used to form sintered particles that have a size of about 20-200 microns and form the contiguous structure and passageways of the sintered powder. A porous enclosure can also be provided that is attached to the base and configured to enclose the sintered powder. The porous enclosure can include openings having a size to permit cooling liquid and vapor bubbles in the cooling liquid to pass through the porous enclosure and to prevent passage of individual sintered powder particles that are dislodged from the contiguous structure from passing through the porous enclosure. As an example, the porous enclosure can be formed of a wire mesh having a mesh opening size that is smaller than a majority, most or all of the sintered powder particles that form the contiguous structure. Therefore, if one or more sintered particles is dislodged from the continuous structure, e.g., by rapid vapor bubble formation and/or rapid thermal expansion/contraction, the sintered particles can be trapped inside the porous enclosure. This can help prevent the dislodged sintered particles from contacting electrical traces, wiring or other components in the cooling liquid which can cause signal disruption and/or damage.

In some embodiments, the base has first and second sides with the first side of the base being thermally coupled to the heat generating device and the second side of the base being coupled to the sintered powder. In some cases, the sintered powder is coupled to the base such that the sintered powder and the base are fixed together and the base is configured to support the sintered powder. For example, the base can include a plurality of fins or other structure and the sintered powder can be arranged to form a coating having a thickness over the plurality of fins or other structure. Alternately, the sintered powder can be arranged over a flat, planar surface of the base. In some embodiments, the porous enclosure is attached to the second side of the base. For example, the porous enclosure can define a cavity in which at least a portion of the sintered powder is received. An edge or flange that defines an opening to the cavity can be attached to the base. As one example, the edge can be received into a groove formed in a surface of the base that extends around the sintered powder. The porous enclosure can be arranged out of contact with the sintered powder or can contact the sintered powder in one or more locations.

These and other aspects of the invention will be appreciated from the following description and claims.

BRIEF DESCRIPTION OF THE DRAWINGS

Aspects of the invention are described with reference to the following drawings in which numerals reference like elements, and wherein.

DETAILED DESCRIPTION

Figure 1:
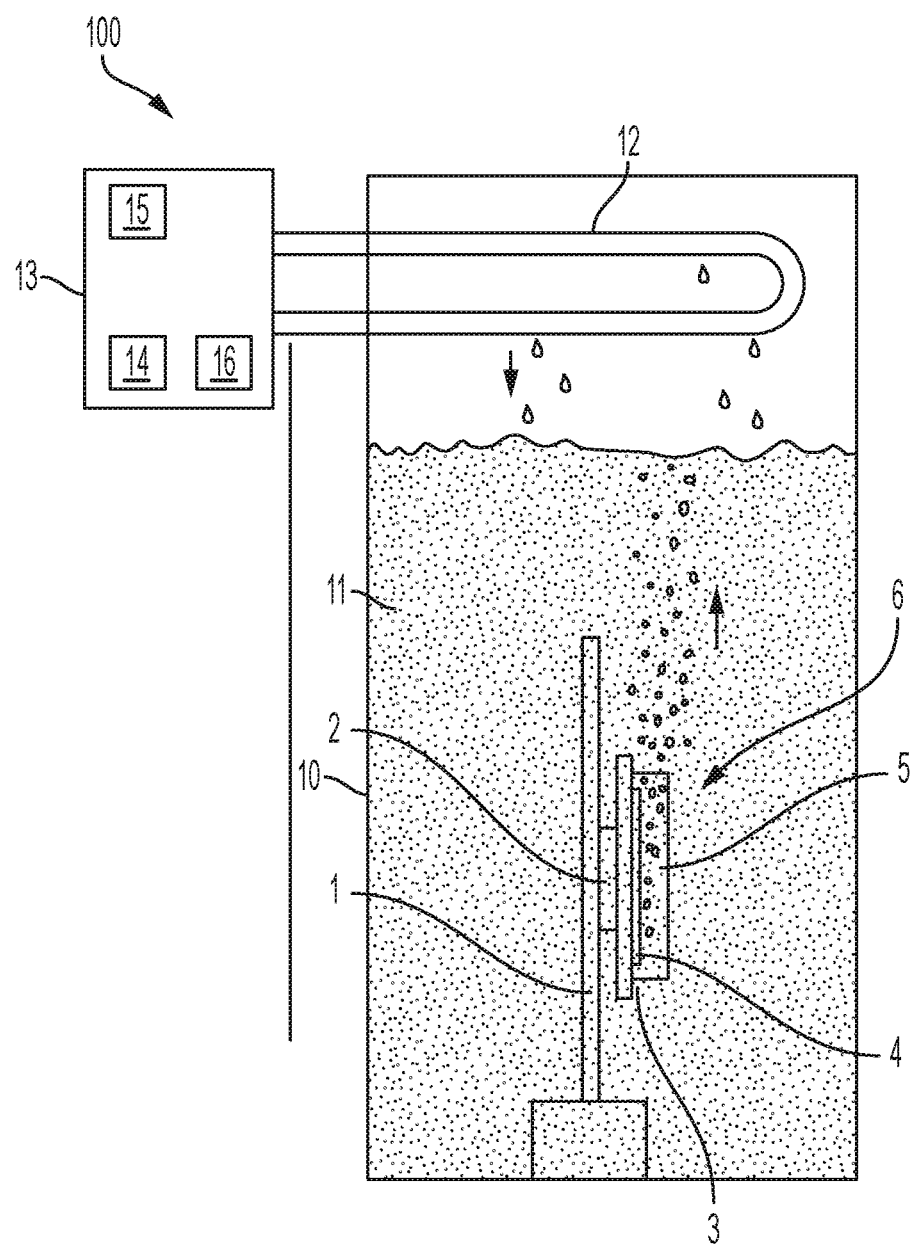
FIG. 1 is a schematic view of an immersion cooling system in an illustrative embodiment.

Aspects of the invention are not limited in application to the details of construction and the arrangement of components set forth in the following description or illustrated in the drawings. Other embodiments may be employed and aspects of the invention may be practiced or be carried out in various ways. Also, aspects and/or different features of embodiments may be used alone or in any suitable combination with each other. Thus, the phraseology and terminology used herein is for the purpose of description and should not be regarded as limiting.

Heat sinks are vitally important to cool critical electronics components such as CPU's, GPU's, FPGA's and other ASIC's in advanced electronics equipment. The heat sinks are attached to the electronics components and enable heat from the components to be transferred to flowing fluids that come into contact with the heat sinks. Fluid flow may be achieved by natural motion resulting from the action of gravity on density differences within the fluid or by forced means such as fans and pumps. As power levels and heat densities of electronics components and systems have increased, more and more sophisticated heat sinks have been developed to remove the heat and prevent excessive component temperatures. Two-phase immersion cooling is a more recent technology where the electronics system is immersed completely within a pool of dielectric cooling liquid that is maintained near its boiling point and allowed to vaporize when heated. Heat sinks for immersion cooling provide a base plate that attaches to the component to receive heat from a heat generating device (such as an integrated circuit) and an enhanced boiling surface coating to transfer the heat by efficient boiling of the dielectric fluid. The vaporized fluid rises to the surface of the liquid pool, condenses on a cold heat exchange surface, and drips back into the pool as a liquid.

Sintering copper or other metal powder into a copper or other metal plate is a cost effective way to make a high performance boiling coating for heat sinks for two-phase immersion cooling. This type of surface coating has shown the highest boiling performance for many dielectric fluids that are suitable for two-phase immersion cooling of electronics. The copper or other metal powder sintering process is similar to that used to make wicks in heat pipes and vapor chambers. Adhering the copper powder to a copper plate is a balance between a) the need for minimal bonding between the particles so pore-to-pore pathways between sintered metal particles remain open and allow fluid to easily enter and depart the boiling sites, and b) strong bonding, accompanied by greater shrinkage and occluding of the pores, to make the structure strong and robust. Invariably, some of the powder particles are only weakly bonded to their neighbors. When liquid boils vigorously within the pores, the particles experience significant mechanical forces due to liquid inertia and pressure oscillations as vapor bubbles nucleate, grow, and depart within the porous coating. These fluctuating stresses, over time, cause the weakly bonded particles to break off from the porous coating and float into the cooling liquid in the pool. These metal particles can land on exposed circuit traces or connectors and cause signal errors or even damage and failure of the electronics. Aspects described herein help eliminate the risk of shedding copper particles from sintered metal powder boiling surfaces in immersion cooling by enclosing the sintered metal structure in a porous enclosure that allows cooling liquid flow through the enclosure, but resists passage of loose metal particles. The result is an arrangement that is mechanically robust, low risk, low-cost, and provides high-performance boiling surfaces, while minimizing risk of damage to or faulty operation of electronic circuitry caused by metal particles that may be released from the sintered powder structure.

FIG. 1 shows a two-phase liquid immersion cooling system 100 in an illustrative embodiment. While embodiments of a heat sink are described in connection with a two-phase immersion cooling system, use with such systems is not required, e.g., a heat sink including features described herein can be used with a single phase immersion cooling system or other arrangements. In FIG. 1, the system 100 includes a tank 10 configured to hold a cooling liquid 11, such as a dielectric liquid that has a suitable boiling temperature and pressure to allow for effective cooling of heat generating devices 2, such as integrated circuits and other electronic devices, that are immersed in the cooling liquid 11. Heat generating devices 2 can be supported on a printed circuit board or other support 1 that can include other electronic components such as metal traces or wiring used to provide electrical communications between the heat generating devices 2 and other components, e.g., for electrical power, data communications, sensing, control signals, etc. While in this embodiment the heat generating devices 2 and/or other electrical components on a printed circuit board or other support 1 are immersed in and in contact with the cooling liquid, other arrangements are possible. In some embodiments, heat generating devices 2 and other electrical components can be isolated or otherwise protected from direct contact with the cooling liquid, e.g., components can be housed in a liquid-tight enclosure in the cooling liquid 11. In some embodiments, heat in the tank 10 can be removed by a heat exchanger 12 and associated heat transfer system 13. The heat transfer system 13 can be arranged in any suitable way, e.g., having a pump 14 to circulate a heat transfer fluid between the in-tank heat exchanger 12 and an outside heat exchanger 15 to transfer heat from the tank 10 to a surrounding environment (e.g., the air, water and/or earth outside of the tank 10), and a controller 16 to control operations of the pump 14 and other components of the heat transfer system 13. The heat transfer system 13 can function to cool vapor in the tank 10 so the vapor is condensed to liquid and falls back into the cooling liquid 11.

A heat sink 6 is thermally coupled to the heat generating device 2 so as to receive heat from the heat generating device 2 and transfer the heat to the cooling liquid 11. Coupling of the heat sink 6 to the heat generating device 2 can be done in any suitable way, such as by physically contacting a surface of the heat sink 6 with the heat generating device 2, providing a thermal grease or other component between the heat sink 6 and the heat generating device 2 to transfer heat between the two, and others. In some embodiments, the heat sink 6 includes a base 3, e.g., a metal plate, that is attached to or otherwise in physical contact with the heat generating device 2 so that heat can be transferred by conduction from the heat generating device 2 to the base 3. The heat sink 6 also includes a sintered powder 4 thermally coupled to the base 3 and configured to receive heat from the base 3 and transfer the heat to the cooling liquid 11. As an example, the sintered powder 4 can form a coating over portions of the base 3 so that heat can be transferred from the base 3 to the sintered powder 4 by conduction. The sintered powder 4 can have powder sintered or otherwise joined together directly on the base 3, or the sintered powder 4 can be sintered or otherwise joined to form a structure that is later attached to the base 3. In some cases, the sintered powder 4 is arranged as a coating on the base 3, and the coating can be arranged with any suitable thickness, shape or other structural features. In some embodiments, the sintered powder 4 is coupled to the base 3 such that the sintered powder 4 and the base 3 are fixed together and the base 3 is configured to mechanically support the sintered powder 4, e.g., so that the heat sink 6 can be oriented in any way with respect to gravity and the sintered powder 4 will remain supported on the base 3. In some embodiments, the sintered powder 4 includes particles that are joined together to form a contiguous structure having spaces between particles to form fluid passageways in the contiguous structure. The passageways can be arranged to permit cooling liquid to flow into the fluid passageways and permit vapor bubbles generated by transfer of heat from the sintered powder to the cooling liquid to flow out of the passageways. Conceptually, the sintered powder 4 can be arranged like a sponge so that cooling liquid can flow into interior spaces of the contiguous structure. As heat is transferred from the sintered powder 4 to the cooling liquid in the passageways, the cooling liquid 11 can vaporize and form bubbles. These bubbles can flow out of the sintered powder 4 structure, e.g., under the force of gravity, thereby causing additional cooling liquid 11 to flow into the area vacated by the escaping bubbles.

As described above, the transfer of heat from the sintered powder 4 to the cooling liquid 11 can cause relatively loosely bound particles to be dislodged from the contiguous structure of the sintered powder 4. That is, during manufacture of the sintered powder 4 structure, copper, aluminum or other metal powder is sintered, brazed or otherwise joined to form larger sintered particles that are joined together in a way to provide passageways between the particles. This arrangement can result in some sintered particles being more loosely bound to the contiguous structure than others, and it is these relatively larger sintered particles that can become released from the sintered powder structure. For example, heating of the cooling liquid can cause mechanical stresses, e.g., by rapid growth and movement of vapor bubbles during boiling of the cooling liquid 11. This can dislodge some sintered particles of the sintered powder 4 structure, and the dislodged particles can come into contact with electrical components, such as metal traces or other wiring associated with a heat generating device 2. This contact can cause signaling or other operation problems with the electrical components.

To help prevent such problems, a heat sink 6 can be provided with a porous enclosure 5 that is attached to the base 3 and configured to enclose the sintered powder 4. The porous enclosure 5 can have openings with a size configured to permit cooling liquid 11 and vapor bubbles in the cooling liquid 11 to pass through the porous enclosure 5 and yet prevent passage of individual sintered powder 4 particles dislodged from the contiguous structure from passing through the porous enclosure 5. Thus, if particles are dislodged from the sintered powder structure, the loose particles can be contained within the porous enclosure 5 and prevented from contacting electrical wiring or other components in the cooling liquid 11. In some embodiments, the porous enclosure 5 includes a wire mesh, e.g., a metal wire mesh that can in some cases aid in heat transfer between the base 3 and the cooling liquid 11. The wire mesh can have mesh openings sized to contain sintered powder particles within the enclosure 5. For example, in some cases the sintered powder includes sintered metal powder having a size of 10-200 microns before sintering. After sintering such powder onto the base 3 or otherwise to form a sintered powder structure, the more loosely bound sintered particles may be larger than the smallest powder size, for example larger than 70 microns. The porous enclosure 5, e.g., a wire mesh, can have openings with a size that is at or below the loosely bound particle sizes of the sintered powder 4, for example mesh #230 with 63 micron openings. In some embodiments, metal powder that is used to form sintered powder particles can have a size that is less than the size of openings of the porous enclosure 5, and the sintered powder particles can have a size that is greater than the size of the openings of the porous enclosure 5. In some embodiments, the porous enclosure 5 need not be electrically and/or thermally conductive, but rather could be made electrically and/or thermally insulating, e.g., of a plastic material.

Figure 2:
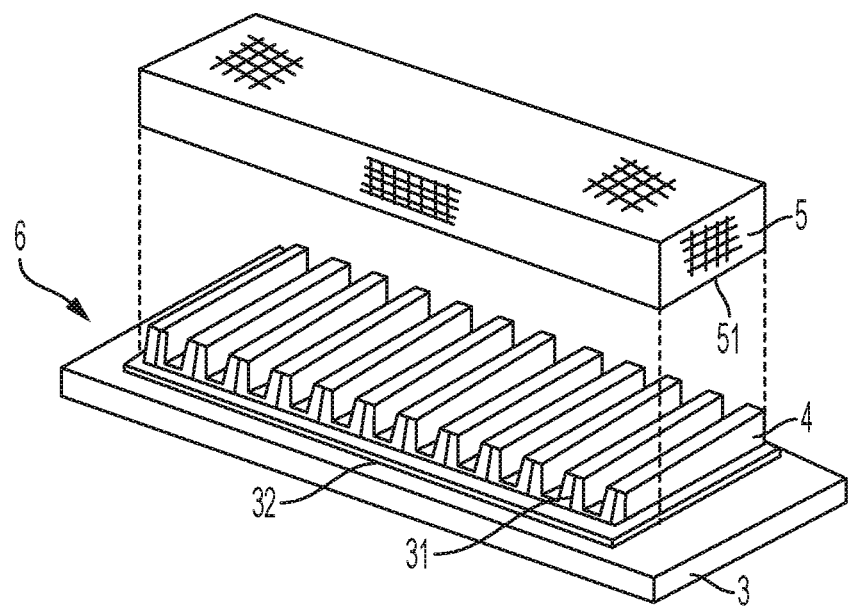
FIG. 2 shows an exploded perspective view of a heat sink including a sintered powder and porous enclosure in an illustrative embodiment.

FIG. 2 shows a perspective view of a heat sink 6 in one illustrative embodiment, e.g., that could be employed in the FIG. 1 system 100. In the FIG. 2 embodiment, the base 3 includes a plate, e.g., made of copper, aluminum or other suitable material, that has first and second sides. A first side, e.g., the bottom in FIG. 2, can be configured to mate with a heat generating device 2 to receive heat. In some cases, the first side can be made flat and planar to contact a planar surface of the heat generating device 2, while in other embodiments the first side can be shaped in other ways, e.g., so as to conform to or otherwise suitably mate with a surface of a heat generating device 2. The base 3 can include holes, fasteners or other structure to secure the base 3 to a heat generating device 2. A second side of the base 3, e.g., the top in FIG. 2, can be thermally and mechanically coupled to the sintered powder 4 so that heat received from the heat generating device 2 can be transferred to the sintered powder 4. In some embodiments and as shown in FIG. 2, the base 3 can have a plurality of fins, pins or other structure 31 to increase a surface area of the base used to transfer heat to the sintered powder 4. The sintered powder 4 can be arranged as a type of coating or covering having a thickness over the fins 31 or other portion of the base 3. For example, the coating thickness may be 100 to 1000 microns. In some embodiments, the sintered powder 4 can conform to the shape of the fins 31 or other structure at an inner side of the sintered powder 4 structure, and present a similar shape at an outer side of the sintered powder 4 structure, e.g., a fin shape as shown in FIG. 2. In some embodiments, the shape of the outer side of the sintered powder 4 structure may have a fin shape to more efficiently direct fluid flow over and through the heat sink under the action of gravity. In some embodiments, the sintered powder 4 can conform to the shape of the base 3 at an inner side and present a different shape at an outer side, e.g., the sintered powder 4 in FIG. 2 could be arranged to have a rectangular box shape rather than define a plurality of parallel fins. The porous enclosure 5 is attached to the second side of the base 3 over the sintered powder 4 structure so that the sintered powder 4 is enclosed. In some embodiments, the porous enclosure 5 defines a cavity in which at least a portion of the sintered powder 4 is received. As an example, the porous enclosure 5 can have a hollow rectangular box configuration with an open bottom side. The porous enclosure 5 can be placed over the sintered powder 4 so that a lower edge 51 of the porous enclosure 5 that defines an opening to the cavity contacts the base 3. The edge 51 of the porous enclosure 5 can be attached to the base 3, e.g., by welding, adhesive, interference fit, heat staking, fasteners, etc. In some embodiments, the edge 51 is received into a groove 32 formed in a surface of the base 3. For example, the groove 32 can extend around the sintered powder 4 and receive the edge 51 of the porous enclosure 5 so that the porous enclosure 5 is attached to the base 3 and any sintered powder particles over a size of the openings of the porous enclosure 5 are contained within the porous enclosure.

Figure 3:
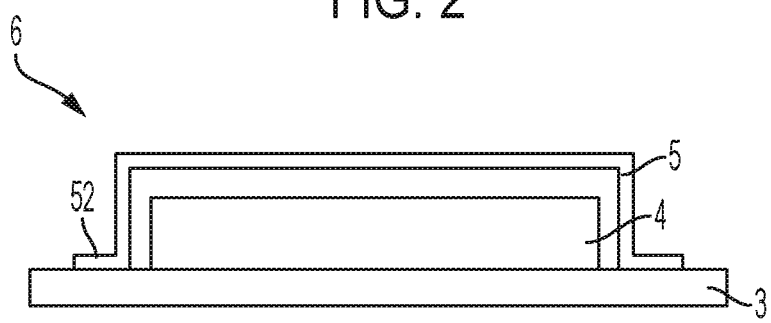
FIG. 3 is a side view of a heat sink in another illustrative embodiment.

FIG. 3 shows another illustrative embodiment in which the porous enclosure 5 includes a flange 52 rather than an edge that defines an opening to a cavity in which the sintered powder 4 is received. The flange 52 can contact the base 3 and be attached to it, e.g., by adhesive, fasteners, heat staking, etc. Where the porous enclosure 5 functions to help transfer heat to the cooling liquid 11 as well as contain particles of sintered powder 4, an increased surface area of contact between the base 3 and the porous enclosure 5 can help improve heat transfer. A flange 52 arrangement like that in FIG. 3 or similar configurations can help increase a surface area of contact. In some embodiments, the porous enclosure 5 is completely or partially out of contact with the sintered powder 4, e.g., a gap or space is present between the sintered powder 4 and the porous enclosure 5 as can be seen in FIG. 3. This gap or space can help provide for better convective or other flow around the sintered powder 4 in some cases. In other embodiments, the porous enclosure 5 can be in contact with the sintered powder 4 at least over some portions of the sintered powder 4. This can help keep particles of sintered powder 4 from being dislodged in some cases and/or aid in conductive heat transfer between the sintered powder 4 and the porous enclosure 5. In some embodiments, the porous enclosure 5 can attach the sintered powder 4 to the base 3. That is, the sintered powder 4 can be formed into a contiguous structure separate from the base 3 and attached to the base 3 by securing the porous enclosure 5 over the sintered powder 4 and to the base 3.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified.

The use of "including," "comprising," "having," "containing," "involving," and/or variations thereof herein, is meant to encompass the items listed thereafter and equivalents thereof as well as additional items.

It should also be understood that, unless clearly indicated to the contrary, in any methods claimed herein that include more than one step or act, the order of the steps or acts of the method is not necessarily limited to the order in which the steps or acts of the method are recited.

While aspects of the invention have been described with reference to various illustrative embodiments, such aspects are not limited to the embodiments described. Thus, it is evident that many alternatives, modifications, and variations of the embodiments described will be apparent to those skilled in the art. Accordingly, embodiments as set forth herein are intended to be illustrative, not limiting. Various changes may be made without departing from the spirit of aspects of the invention.

The invention claimed is:

1. An immersion cooling system, comprising:
   a tank configured to hold a cooling liquid;
   a heat generating device arranged in the tank and configured to generate heat;
   a heat sink thermally coupled to the heat generating device and including,
      a base coupled to the heat generating device so as to receive heat from the heat generating device,
      a sintered powder thermally coupled to the base and configured to receive heat from the base and transfer the heat to the cooling liquid, the sintered powder including sintered particles that are joined together to form a contiguous structure having spaces between particles to form fluid passageways in the contiguous structure to permit cooling liquid to flow into the fluid passageways and permit vapor bubbles generated by transfer of heat from the sintered powder to the cooling liquid to flow out of the passageways, and
      a porous enclosure that is attached to the base and configured to enclose the sintered powder, the porous enclosure including openings having a size to permit cooling liquid and vapor bubbles in the cooling liquid to pass through the porous enclosure and to prevent passage of individual sintered powder particles dislodged from the contiguous structure from passing through the porous enclosure.

2. The system of claim 1, wherein the base has first and second sides, the first side of the base being thermally coupled to the heat generating device and the second side of the base being coupled to the sintered powder.

3. The system of claim 2, wherein the sintered powder is coupled to the base such that sintered powder and the base are fixed together and the base is configured to support the sintered powder.

4. The system of claim 2, wherein the porous enclosure is attached to the second side of the base.

5. The system of claim 1, wherein the porous enclosure includes a mesh.

6. The system of claim 1, wherein the sintered powder includes a sintered metal powder particles having a size of 10 to 200 microns.

7. The system of claim 1, wherein the heat generating device includes an electronic circuit that is in contact with cooling liquid.

8. The system of claim 1, wherein the base includes a plurality of fins and the sintered powder is arranged to form a coating having a thickness over the plurality of fins.

9. The system of claim 1, wherein the porous enclosure defines a cavity in which at least a portion of the sintered powder is received.

10. The system of claim 9, wherein the porous enclosure includes an edge that defines an opening to the cavity, and the edge is attached to the base.

11. The system of claim 10, wherein the edge is received into a groove formed in a surface of the base, the groove extending around the sintered powder.

12. The system of claim 9, wherein the porous enclosure includes a flange that defines an opening to the cavity, and the flange is attached to the base.

13. The system of claim 1, wherein the porous enclosure is in contact with the sintered powder at least over some portions of the sintered powder.

14. A heat sink for use in cooling a heat generating device in an immersion cooling system, comprising:
   a base configured to couple with the heat generating device so as to receive heat from the heat generating device, the base including a plurality of fins;
   a sintered powder thermally coupled to the base, arranged to form a coating having a thickness over the plurality of fins, and configured to receive heat from the base and transfer the heat to a cooling liquid in the immersion cooling system, the sintered powder including particles that are joined together to form a contiguous structure having spaces between particles to form fluid passageways in the contiguous structure to permit cooling liquid to flow into the fluid passageways and permit vapor bubbles generated by transfer of heat from the sintered powder to the cooling liquid to flow out of the passageways; and
   a porous enclosure that is attached to the base and configured to enclose the sintered powder, the porous enclosure including openings having a size to permit cooling liquid and vapor bubbles in the cooling liquid to pass through the porous enclosure and to prevent passage of individual sintered powder particles dislodged from the contiguous structure from passing through the porous enclosure.

15. The heat sink of claim 14, wherein the base has first and second sides, the first side of the base being configured to be thermally coupled to the heat generating device and the second side of the base being coupled to the sintered powder.

16. The heat sink of claim 15, wherein the sintered powder is coupled to the base such that sintered powder and the base are fixed together and the base is configured to support the sintered powder.

17. The heat sink of claim 15, wherein the porous enclosure is attached to the second side of the base.

18. The heat sink of claim 14, wherein the porous enclosure includes a wire mesh.

19. The heat sink of claim 14, wherein the sintered powder includes a sintered metal powder particles having a size of 10 to 200 microns.

20. The heat sink of claim 14, wherein the porous enclosure defines a cavity in which at least a portion of the sintered powder is received.

21. The heat sink of claim 20, wherein the porous enclosure includes an edge that defines an opening to the cavity and the edge is received into a groove formed in a surface of the base, the groove extending around the sintered powder.

22. The heat sink of claim 14, wherein the porous enclosure includes a flange that defines an opening to the cavity, and the flange is attached to the base.

23. The heat sink of claim 14, wherein the porous enclosure is in contact with the sintered powder at least over some portions of the sintered powder.

24. The heat sink of claim 23, wherein the porous enclosure is in contact with the sintered powder to aid in conductive heat transfer between the sintered powder and the porous enclosure.

* * * * *